(12) United States Patent
Wu et al.

(10) Patent No.: US 10,625,691 B2
(45) Date of Patent: Apr. 21, 2020

(54) AUTOMOBILE, AUTOMOBILE PLATED PART, AUTOMOBILE PLATED PART MOLD AND MANUFACTURING METHOD THEREOF

(71) Applicant: NIO CO., LTD., Shanghai (CN)

(72) Inventors: Wei Wu, Shanghai (CN); Wenhai Lu, Shanghai (CN); Qihua Zhang, Shanghai (CN); Jieping Guo, Shanghai (CN); Gary Denton, Shanghai (CN)

(73) Assignee: NIO CO., LTD., Shanghai (CN)

( * ) Notice: Subject to any disclaimer, the term of this patent is extended or adjusted under 35 U.S.C. 154(b) by 98 days.

(21) Appl. No.: 15/949,524

(22) Filed: Apr. 10, 2018

(65) Prior Publication Data

US 2018/0290604 A1    Oct. 11, 2018

(30) Foreign Application Priority Data

Apr. 10, 2017 (CN) .................... 2017 2 0368156 U
Apr. 11, 2017 (CN) .......................... 2017 1 0242062

(51) Int. Cl.
*B60R 13/04* (2006.01)
*G06F 17/50* (2006.01)
(Continued)

(52) U.S. Cl.
CPC .......... *B60R 13/04* (2013.01); *B29C 45/7693* (2013.01); *B60R 19/52* (2013.01); *G06F 17/5009* (2013.01); *B29C 45/76* (2013.01); *B29C 2945/76103* (2013.01); *B29C 2945/76434* (2013.01); *B29C 2945/76588* (2013.01);
(Continued)

(58) Field of Classification Search
CPC ... B60R 13/04; B60R 19/52; B60R 2019/527; G06F 17/5009; G06F 17/5095; B29C 45/76; B29C 2945/76434; B29C 2945/76588; B29C 2945/76892; B29L 2031/3005; B60Y 2410/122
See application file for complete search history.

(56) References Cited

U.S. PATENT DOCUMENTS 1,526,479 A * 2/1925 Singer Karper ........ B60R 21/34
293/44
2,194,459 A * 3/1940 Milton .................... B60R 19/04
293/143

(Continued)

*Primary Examiner* — Lori L Lyjak
(74) *Attorney, Agent, or Firm* — Sheridan Ross P.C.

(57) ABSTRACT

The application belongs to the technical field of automobile plated part, and in particular relates to an automobile, an automobile plated part, an automobile plated part mold and a manufacturing method thereof. The method for manufacturing automobile plated part mold comprises the steps of: establishing a first simulation model of the automobile plated part mold based on a set shape of the substrate of the automobile plated part; using the first simulation model to simulate injection process of the substrate to obtain a first simulation substrate; performing at least one modification processing on the first simulation model, so that a second simulation model thus obtained satisfies the following requirements: using the second simulation model to simulate the injection process of the substrate to obtain a second simulation substrate conforming to the set shape; manufacturing the automobile plated mold according to the second simulation model.

18 Claims, 6 Drawing Sheets

(51) Int. Cl.
  *B60R 19/52* (2006.01)
  *B29C 45/76* (2006.01)
  *B29L 31/30* (2006.01)
(52) U.S. Cl.
  CPC ............... *B29C 2945/76892* (2013.01); *B29C 2945/76913* (2013.01); *B29L 2031/3005* (2013.01); *B60R 2019/527* (2013.01); *B60Y 2410/122* (2013.01); *G06F 17/5095* (2013.01)

(56) References Cited

U.S. PATENT DOCUMENTS

| | | | | |
|---|---|---|---|---|
| 2,248,236 | A * | 7/1941 | Hollins | H01Q 1/3283 343/712 |
| 7,661,745 | B2 * | 2/2010 | Schaupensteiner | B62D 25/14 296/72 |
| 7,845,714 | B2 * | 12/2010 | Fischer | B62D 25/084 296/193.09 |
| D685,703 | S * | 7/2013 | Nemoto | D12/181 |
| 8,939,478 | B2 * | 1/2015 | Fisher | B60R 19/54 293/115 |
| 2002/0100626 | A1 * | 8/2002 | Kang | B60K 11/04 180/68.4 |
| 2004/0041439 | A1 * | 3/2004 | Kafuku | B62D 25/084 296/193.09 |
| 2004/0084236 | A1 * | 5/2004 | Okai | B62D 25/08 180/68.4 |
| 2006/0255602 | A1 * | 11/2006 | Evans | B60R 19/18 293/120 |
| 2007/0063521 | A1 * | 3/2007 | Lancashire | C25D 3/12 293/102 |
| 2016/0347229 | A1 * | 12/2016 | Collazo | B60P 3/125 |

* cited by examiner

“AUTOMOBILE, AUTOMOBILE PLATED PART, AUTOMOBILE PLATED PART MOLD AND MANUFACTURING METHOD THEREOF”

CROSS-REFERENCE TO RELATED APPLICATIONS

This application claims the benefit of China Patent Application No. 201720368156.4 filed Apr. 10, 2017, and China Patent Application No. 201710242062.7 filed Apr. 11, 2017, the entire contents of each of which are incorporated herein by reference in their entirety.

TECHNICAL FIELD

The application belongs to the technical field of automobile plated part, and in particular relates to an automobile, an automobile plated part, an automobile plated part mold and a manufacturing method thereof.

BACKGROUND

Front and rear bumper assemblies of automobiles are mainly used to absorb and mitigate external impact forces when automobiles collide with other objects. Automobile body, including the front bumper assembly, is usually provided with plated strips. However, existing plated strips are usually a simple strip structure, or the plated strips of some models are modified into a segmented strip structure. Existing plated strips are generally simple in structure and have only decorative effects and lack practicality.

At present, plated strips are generally manufactured by injection molding using a mold. However, when the structure of the plated strip is complex and the size is large, the plated strip will have a certain deformation during manufacturing process, especially the injection cooling process, resulting in deviation between real size, shape and expected size, shape of the plated strip. That is, the existing plated strip manufacturing process cannot meet the needs of plated strips with complex structure and large size.

SUMMARY

In order to solve the above problems in the prior art, the present application provides an automobile plated part, which comprises a substrate and a plated layer coated on the substrate, wherein the substrate includes a main bar, a first bar set and a second bar set extend from both ends of the main bar respectively; wherein the first bar set includes two bars extending in different directions; wherein the second bar set includes two bars extending in different directions.

In a preferred embodiment of the automobile plated part described above, the first bar set includes a first bar extending from the first end of the main bar in a first direction and a second bar extending from the first end of the main bar in a second direction, wherein a first angle is formed between the first direction and the second direction.

In a preferred embodiment of the automobile plated part described above, a third bar extends in a third direction from an end of the first bar away from the main bar, wherein a second angle is formed between the third direction and the first direction.

In a preferred embodiment of the automobile plated part described above, a fourth bar extends in a fourth direction from an end of the second bar away from the main bar, wherein a third angle is formed between the fourth direction and the second direction.

In a preferred embodiment of the automobile plated part described above, at least a portion of the substrate has connection parts through which the automobile plated part can be mounted to a front bumper assembly of the automobile, and/or the substrate can be fixed to the front bumper assembly by bonding or welding.

In a preferred embodiment of the automobile plated part described above, after the automobile plated part is assembled to the front bumper assembly of the automobile, each of the first bar set and the second bar set has a bar extending toward the side of the automobile body closest to itself, so that the automobile plated part appears to surround the front bumper assembly of the automobile as viewed from the front of the automobile toward the front bumper assembly.

In a preferred embodiment of the automobile plated part described above, the front bumper assembly is further provided with a front grille, and the main bar of the automobile plated part is located above the front grille.

In a preferred embodiment of the automobile plated part described above, the first bar set and the second bar set are of symmetrical structures.

In a preferred embodiment of the automobile plated part described above, combination of the main bar, the first bar set and the second bar set endows the entire automobile plated part with an X-shaped structure.

The present application also provides an automobile plated part mold that is used to manufacture the substrate of an automobile plated part as described above.

In another aspect, the present application also provides a method for manufacturing automobile plated part mold described above, which comprises the following steps: establishing a first simulation model of the automobile plated part mold based on a set shape of the substrate of the automobile plated part; using the first simulation model to simulate injection process of the substrate to obtain a first simulation substrate; performing at least one modification processing on the first simulation model, so that a second simulation model thus obtained satisfies the following requirements: using the second simulation model to simulate the injection process of the substrate to obtain a second simulation substrate conforming to the set shape; manufacturing the automobile plated part mold according to the second simulation model.

In a preferred embodiment of the above method for manufacturing automobile plated part mold, the step "establishing a first simulation model of the automobile plated part mold based on a set shape of the substrate of the automobile plated part" further includes: establishing the first simulation model of the automobile plated part mold using a simulation software.

In a preferred embodiment of the above method for manufacturing automobile plated part mold, the step "performing at least one modification processing on the first simulation model" includes: obtaining a simulated deformation amount of the shape of the first simulation substrate compared to the set shape during cooling of injection molding; setting a simulated modification amount of the first simulation model according to the simulated deformation amount, which is used to counteract at least a part of the simulated deformation amount; performing a first modification processing on the first simulation model according to the simulated modification amount to obtain the second simulation model; using the second simulation model to simulate the injection process of the substrate again to obtain a second simulation substrate; determining whether the shape of the second simulation substrate conforms to the set shape: if no, the simulated modification amount of the first simulation model is reset until the shape of the second simulation substrate conforms to the set shape; if yes, the automobile plated part mold is manufactured according to the second simulation model.

In a preferred embodiment of the above method for manufacturing automobile plated part mold, before the step "setting a simulated modification amount of the first simulation model according to the simulated deformation amount", the step "performing at least one modification processing on the first simulation model" further comprises: manufacturing a first soft mold according to the first simulation model, and manufacturing a first soft mold sample of the substrate using the first soft mold; acquiring an actual deformation amount of the first soft mold sample in the cooling process compared to the set shape, and determining whether the deviation between the actual deformation amount and the simulated deformation amount is within a preset range; if yes, the simulated modification amount of the first simulation model is set according to the simulated deformation amount; if not, the first simulation model is reestablished until the deviation between the actual deformation amount and the simulated deformation amount is within the preset range.

In a preferred embodiment of the above method for manufacturing automobile plated part mold, the step "manufacturing the automobile plated part mold according to the second simulation model." includes: manufacturing a second soft mold according to the second simulation model, and manufacturing a second soft mold sample of the substrate using the second soft mold; determining whether the shape of the second soft mold sample conforms to the set shape; if no, performing a modification processing again on the first simulation model to obtain the second simulation model, until the shape of the second soft mold sample conforms to the set shape; if yes, manufacturing the automobile plated part mold according to the second simulation model.

The present application also provides an automobile which comprises an automobile body and a plated part disposed on the automobile body, wherein the plated part is disposed on a front bumper assembly of the automobile body; wherein the plated part is an automobile plated part described in any of the above solutions.

In a preferred embodiment of the automobile described above, the shape of the plated part conforms to the shape of the front bumper assembly.

In a preferred embodiment of the automobile described above, when the plated part is fixed to the front bumper assembly, the plated part can form a semi-surrounding posture with the front bumper assembly as viewed from the front of the automobile body toward the front face of the automobile.

In a preferred embodiment of the automobile described above, the installation height of the main bar of the plated part has the following characteristics: the height enables the main bar to be above the pedestrian's knees at least when he or she collides with the front of the automobile.

In a preferred embodiment of the automobile described above, the front bumper assembly is further provided with a front grille, and the main bar is located above the front grille.

In the technical solution of the present application, the substrate structure of the automobile plated part has at least a more complicated structure and a larger size than existing plated strips. In order to manufacture an automobile plated part that meets the requirements, the present application firstly uses software (e.g., CAE) to perform injection simulation of an existing automobile plated part sample, and then performs a plurality of modification processing on the first simulation model obtained during the injection molding simulation process, obtaining a second simulation model that meets the requirements. By simulating the problems that parts with complex structures may encounter during the injection molding process, and taking corresponding measures to avoid the problems, the actual injection molding is performed after the results of simulated injection molding meet expectations. In this way, it is not necessary to carry out many actual injection molding processes, and it is not necessary to constantly adjust the actual mold shape based on multiple actual injection molding results. This not only saves materials, but also greatly saves time and improves efficiency.

In addition, during simulation of the injection molding process of existing automobile plated parts using software (e.g., CAE), soft mold test verification is used as an auxiliary means to finally obtain automobile plated parts meeting requirements, in order to ensure accuracy of the simulated injection molding process. That is, through combination of simulation and actual measurement, the modification amount of the mold is calculated, which is used to offset at least a part of the deformation of the automobile plated part, and finally the finished automobile plated part mold is manufactured. The amount of deformation of the automobile plated part is offset by the modification amount of the mold, so that the substrate of the plated part produced by the automobile plated part mold can meet requirements. That is, through the manufacturing method of the present application, the deformation problem of the substrate of the plated part with complex structure and large size in the injection cooling process can be effectively solved, thereby realizing mass production of the substrate of the automobile plated part.

DETAILED DESCRIPTION

Figure 1:
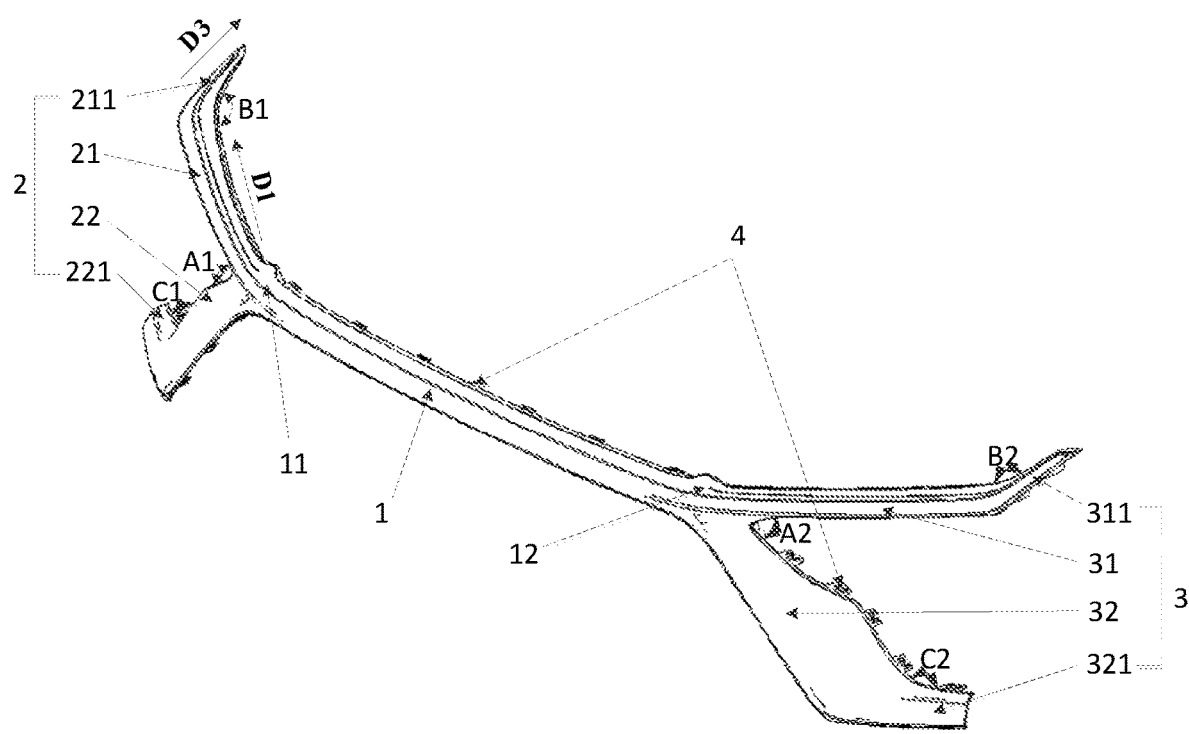
FIG. 1 is a schematic structural view of an automobile plated part according to an embodiment of the present application.

The preferred embodiments of the present application will be described below with reference to the accompanying figures. It will be understood by those skilled in the art that these embodiments are merely used for interpreting the technical principle of the present application and are not intended to limit its protection scope in any way. For example, the members in the figures are drawn to the scale, this dimensional relation is merely exemplary and can be modified as desired by those skilled in the art to accommodate specific applications.

It should be noted that in the description of the present application, the usage of such directional and positional terms as central, upper, lower, left, right, vertical, horizontal, inner and outer is based on the directional and positional relations shown in the drawings, and used to facilitate the description itself and does not express or imply any indispensable specific positions or specific operational and structural positions of the devices or elements of the disclosure. Therefore, the usage is not to be understood as limitation on the present application. Additionally, terms such as first, second and third are merely provided for the purposes of description rather than expressing or implying their relative importance.

Moreover, it should also be noted that in the description of the present application, unless otherwise specified and defined, the terms of install, connect and couple should be construed in their broad meaning, which can be understood as permanent or detachable or integrally connecting, mechanically or electrically connecting, direct connecting or indirect connecting via an intermediate part, or even connecting between the inner parts of two elements. Those skilled in the art could interpret the specific meanings of the above mentioned terms based on the context.

According to an example of the present application, as shown in FIG. 1, an automobile plated part comprises a substrate and a plated layer coated on the substrate. Wherein the substrate includes a main bar 1, a first bar set 2 and a second bar set 3 extend from both ends (the first end 11 and the second end 12) of the main bar 1 respectively. Among others, the first bar set 2 includes at least two bars extending in different directions, and the second bar set 3 also includes at least two bars extending in different directions. Preferably, combination of the main 1, the first bar set 2, and the second bar set 3 endows the entire automobile plated part substantially with an X-shaped structure. More preferably, the first bar set 2 and the second bar set 3 have a symmetrical structure, which corresponds to the structure of the automobile.

It should be noted that the above-mentioned X-shaped structure can be understood in a broad sense, that is to say, the automobile plated part of this embodiment is visually similar to X in shape. For example, it may be an X-shape formed on the same plane or on a different plane by two semicircular arcs adhering to each other; or formed by a line segment of a certain length having a branching structure respectively at each of its two ends, and so on. The X-shape can also be varied in a suitable range to meet different application scenarios. Herein, the shape of the plated part is summarized by "X", which is intended to enable those skilled in the art to more intuitively understand the shape of the plated part of the present application, rather than to limit that the plated part must have a shape exactly same as the letter X.

It should be further noted that the plated part with complex structure of the present application may be any reasonable shape different from a simple strip structure, and is not limited to the aforementioned X-type structure, such as W-type, 8-Type and so on. In the case where the structure cannot be specifically summarized, the structure of the plated part can be understood as having a plurality of bifurcations in a space, each bifurcation can further extend branches, and the bifurcation/branch can be in the same plane or in different planes. In other words, the substrate of the plated part has at least three ends, and the outer edge of the substrate can form a set target shape with a certain degree of complexity in the space. It should be noted that on one hand, the target shape can be understood as follows: as the structure becomes complex, the shape of the plated part has a certain degree of complexity. On the other hand, it can also be understood that the target shape has a larger size due to the relatively large size of the plated part.

For the convenience of description, the symmetrical structure of the first bar set 2 and the second bar set 3 will be taken as an example. Therefore, the preferred embodiment of the present application will be described in detail in conjunction with the specific structure of the first bar set 2.

Figure 3:
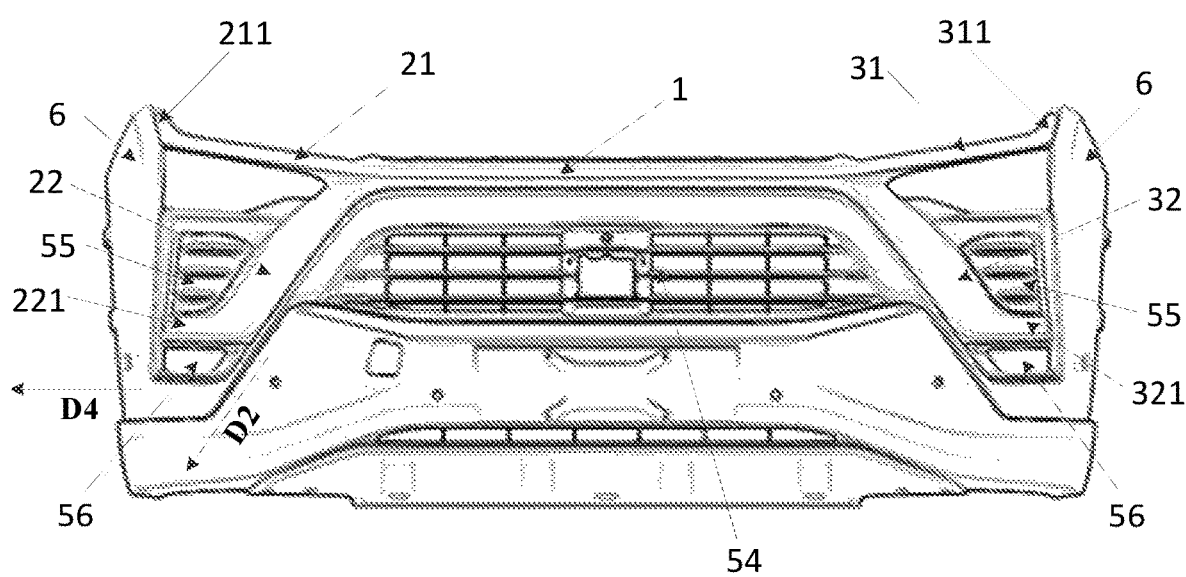
FIG. 3 is an assembly view of an automobile plated part according to an embodiment of the present application.

FIG. 3 is a schematic view of an automobile plated part assembled to an automobile front bumper assembly 5 (front face of the automobile body) according to an embodiment of the present application, wherein the front bumper assembly 5 of the automobile is also provided with a front grille 54. Referring to FIGS. 1 and 3, the first bar set 2 includes a first bar 21 extending from the first end 11 of the main bar 1 in a first direction D1 and a second bar 22 extending from the first end 11 of the main bar 1 in a second direction D2. A first angle A1 is formed between the first direction and the second direction. It can be seen that the main bar 1 is located substantially above the front grille 54 of the automobile. When observing in a direction facing FIGS. 1 and 3, the first direction D1 is generally leftward and rearward from the left end of the main bar 1, in other words, it is a direction along the left end of the main 1 and extending toward the side of the automobile body. The second direction D2 is generally the direction extending downward and leftward from the left end of the main bar 1, and it can be seen that the second bar 22 is located between the side grille 55 and the front grille 54 of the automobile.

Further, a more specific embodiment of an automobile plated part according to an embodiment of the present application will be described with reference to FIGS. 1 and 3. According to this specific embodiment, the first bar 21 has a third bar 211 extending in a third direction D3 at an end away from the main bar 1, and a second angle B1 is formed between the third direction D3 and the first direction D1; the second bar 22 has a fourth bar 221 extending along a fourth direction D4, and a third angle C1 is formed between the fourth direction D4 and the second direction D2. Specifically, still taking the directions illustrated in FIG. 1 an D3 as an example, the third direction is substantially a direction extending leftward and rearward from the left end of the first bar 21, and it can be seen that the first bar 21 presents a posture surrounding the automobile front bumper assembly. The fourth direction is substantially a direction extending leftward from the lower end of the second bar 22, and it can be seen that the fourth bar 22 is located between the automobile side grill 55 and the fog lamp 56. It should be noted that the first angle A1, the second angle B1, and the third angle C1 above are set to explain the relative relationship between the first direction, the second direction, the third direction and the fourth direction. Actually, the specific value of the first angle A1, the second angle B1 and the third angle C1 can all be adaptively adjusted according to the actual shape and size of the automobile front bumper assembly.

From FIG. 3, it can be seen that the automobile plated part according to an example of the present application has a first bar 21 passing over the front of the automobile and slightly extending toward the side of the automobile. In a more specific embodiment of the present application, the third bar 211 is disposed in the third direction, that is to say, the third bar 211 extends from the first bar 21 toward the side of the automobile.

Referring back to FIG. 1, corresponding to the first bar set 2, the second bar set 3 has a fifth bar 31 symmetrical to the first bar 21, a sixth bar 32 symmetrical to the second bar 22, a seventh bar 311 symmetrical to the third bar 211 and the eighth bar 321 symmetrical to the fourth bar 221. Corresponding to the structure of the first bar set 2, the second bar set 3 is also formed with a fourth angle A2 consistent with the first angle A1, a fifth angle B2 consistent with the second angle B1 and sixth angle C2 consistent with the third angle C1. That is to say, the second bar set 3 has a symmetrical structure with the first bar set 2 as a whole. Therefore, the structure of the second bar set 3 will not be further described.

Thus, the first bar set 2 and the second bar set 3 are disposed and extended such that when viewed from the front of the automobile toward the front face of the automobile (i.e., viewed along the X-axis direction of the vehicle coordinates), the automobile plated part presents a posture surrounding the front face of the automobile body.

However, it should be particularly noted that the first bar set 2 and the second bar set 3 mentioned here being symmetrical is a specific example rather than a limitation. First, specific shapes and sizes of the branch bars of each of the first bar set 2 and the second bar set 3 may be different; in some cases, the number of bars included in the first bar set 2 and the second bar set 3 may also be different.

Figure 2A:
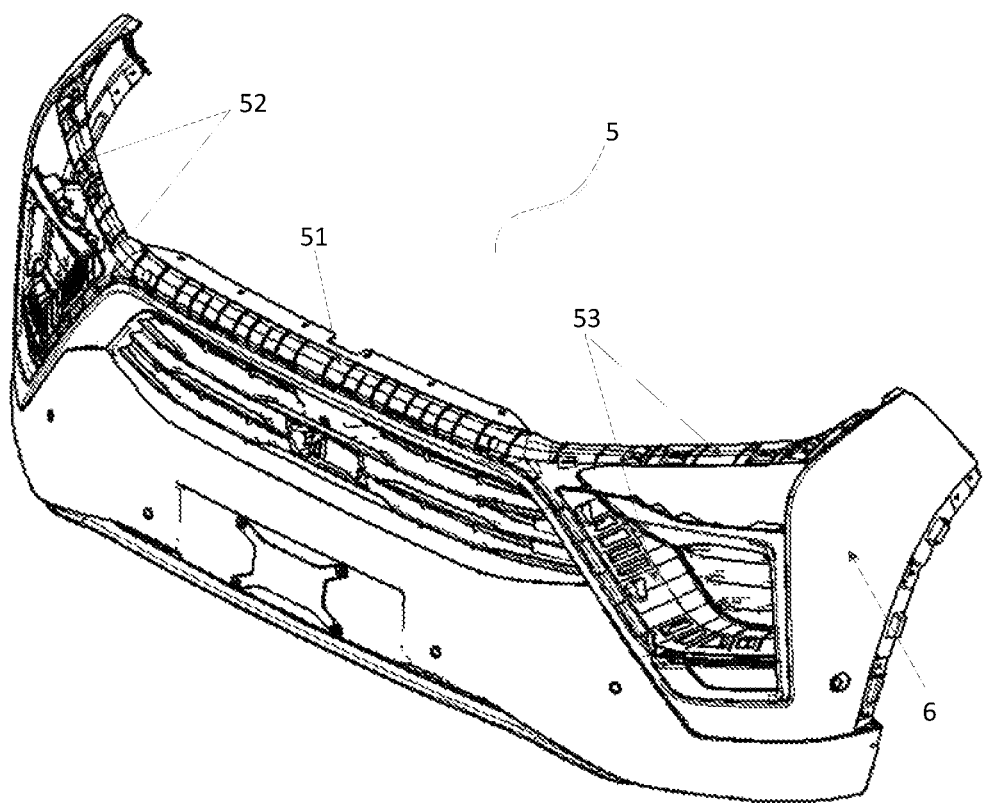
FIG. 2A is a schematic structural view of an automobile front bumper assembly according to an embodiment of the present application, wherein an automobile plated part is mounted on the front bumper assembly of the automobile.
Figure 2B:
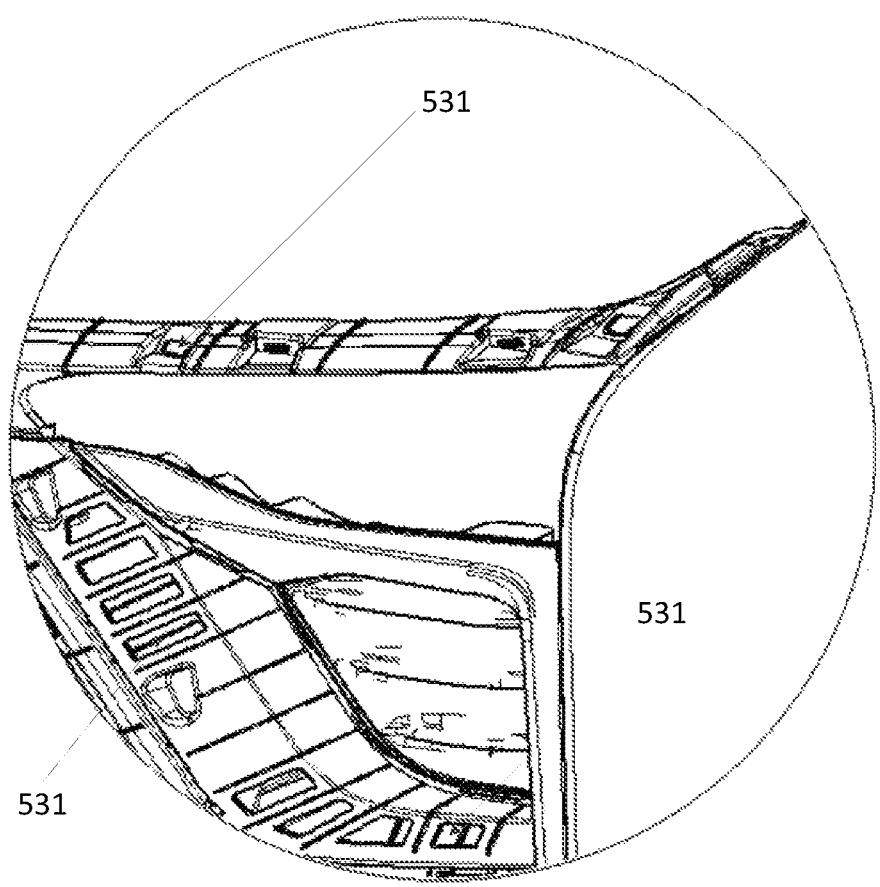
FIG. 2B is a partial enlarged view of an automobile front bumper assembly according to an embodiment of the present application, wherein a mounting position structure of a second bar set of an automobile plated part is shown.

With continued reference to FIG. 1, in the present embodiment, at least a portion of the substrate of the automobile plated part has at least one connection portion, which may be buckles 4 provided on all or part of the structure of the substrate (including the main shaft 1, the first bar set 2 and the second bar set 3). The pated part can be pre-assembled with the front bumper assembly via the buckles 4. Therefore, the shape of the automobile plated part on the side near the front bumper assembly is compatible with the shape of the front bumper assembly and the structure of the covering of the front bumper assembly. On the basis of pre-installation, the installation of the plated parts can be achieved by means of bonding or welding. Referring to FIGS. 2A and 2B, the positional relationship between the automobile plated part of the present application and the front bumper assembly of the automobile in the assembled state will be described in detail.

Referring to FIG. 2A at first, FIG. 2A is a schematic structural view of the automobile front bumper assembly according to an embodiment of the present application, in which the automobile plated part is mounted on the front bumper assembly 5 of the automobile shown in FIG. 2A. As shown in FIG. 2A, the front bumper assembly 5 of the automobile is provided with a main bar mounting position 51, a first bar set mounting position 52 and a second bar set mounting position 53, which match each portions of the automobile plated part respectively. The main bar 1, the first bar set 2 and the second bar set 3 are correspondingly mounted to the main bar set mounting position 51, the first bar set mounting position 52 and the second bar set mounting position 53 respectively. Specifically, referring to FIG. 2B, FIG. 2B is a partial enlarged view of the automobile front bumper assembly 5 (enlarged view of the structure of the second bar set mounting position 53). As shown in FIG. 2B, the second bar set mounting position 53 is provided with a plurality of slots 531 matching the buckles 4 of the automobile plated parts. Similarly, a plurality of slots 531 matching the buckles 4 of the automobile plated parts are also provided on the first bar set mounting position 52 and the main bar mounting position 51.

The process of mounting the automobile plated part to the front bumper assembly is as follows: first, the plated part is inserted into the slots 531 of the front bumper assembly 5 of the automobile through the buckles 4 provided on the substrate, and then the plated part is fixed to the corresponding position of the front bumper assembly 5 of the automobile by welding at some positions (for example, in the middle portion of the main bar). That is, the plated part is reliably fixed to the covering of the front bumper assembly by combination of the buckles 4 and welding. It should be noted that because the plated part in the present embodiment is complex in structure and large in size, the weight is relatively heavier than the existing simple strip-shaped structures. Therefore, in the installation process, the method of pre-installing the automobile plated parts on the front bumper assembly 5 of the automobile through the buckles 4 first could reduce the difficulty in welding.

In a specific embodiment, in the case where the substrate of the automobile plated part is fixed to the front bumper assembly 5, the first bar 21 and the fifth bar 31 abut against the dash panel 6 on both sides of the automobile respectively (the front dash panel 6 of the automobile is also clearly shown in FIG. 2A), and the third bar 211 and the seventh bar 311 protrude into the automobile in an encircling manner along the inner sides of the dash panels 6 on both sides of the automobile. In other words, in the case where the automobile plated part is fixed to the front bumper assembly, the automobile plated part can form a semi-surrounding posture with the front bumper assembly. Corresponding to the semi-surrounding posture, the automobile plated part of the present application has a larger size. For example, in a specific embodiment, the size in the length direction is greater than 1.7 m, the size in the height direction is greater than 0.44 m, and the dimension in the front-rear direction (i.e., depth) is greater than 0.48 m, so this surrounding structure arrangement can ensure reliability of the installation.

Preferably, the mounting height (the height along the Z-axis of the automobile) of the plated part on the automobile front bumper should be above the knee joint of the pedestrian. In this way, when a frontal collision occurs between the automobile and a pedestrian, the main bar of the plated part collides with the pedestrian's body above the knee (upper leg), that is, because the main bar is prevented from colliding with the knee, the legs of the pedestrian could be supported, which effectively prevents the phenomenon in which the main bar collides with the pedestrian's knee, thereby protecting the pedestrian. It should be noted that the expression "above the knee joints of the pedestrians" here can be understood as determined based on the average height of adults, or determined with reference to the average height of adult in combination with the vehicle model and other factors. However, it can be ensured that the plated part of the present application has a higher mounting position in the Z-axis direction of the automobile.

It should be noted that in the above embodiment, because of the structure of the automobile and in order to ensure compatibility with the structure of the automobile and stability of the entire automobile, it is preferable to adopt a symmetrical structure, that is, the first bar set 2 and the second bar set 3 has a symmetrical structure. Yet obviously, the first bar set 2 and the second bar set 3 can also be arranged in an asymmetrical structure. For example, some adaptive variations may be made to adapt to some specific models. In addition, the structure of the automobile plated part of the present application is only a structure generally in X-shape as a whole. According to the actual model, it is possible to flexibly make adaptive adjustments, such as changing the first angle A1, the second angle B1 and the third angle C1, and the size and shape of the (first, second, third, fourth) bars and even the main bar. Obviously, these adjustments and changes do not depart from the protection scope of the present application. In addition, the symmetrical structure is not limited to a perfect symmetrical structure. For certain specific models, a certain range of differences may also be allowed between the first bar set 2 and the second bar set 3, and all of these do not depart from the scope of the application.

In some other examples, the first bar set 2 and/or the second bar set 3 may each include more bars (e.g., in the case where the second bar extends from the first bar, some sub-bars further extend from the second bar, or the first bar set includes a third branch in addition to the two branches of the first bar and the second bar). In this case, combination of the main bar 1, the first bar set 2 and the second bar set 3 does not necessarily make the overall automobile plated part an X-shaped structure. In this case, illustratively, each of the first bar set 2 and the second bar set 3 may still include such a bar that extends toward the side of the automobile body closest to itself (i.e., the side of the automobile) so that the automobile plated part is endowed with a posture surrounding the front bumper assembly when observed from the front of the automobile. It should be noted that although the automobile plated part of the present application has been described with an automobile plated part of X-shaped structure and mounted on an automobile front bumper assembly as an example, those skilled in the art can understand that the present application should not be limited to this. In fact, the user can flexibly set and adjust the structure, size and installation position of the plated part according to needs, actual application scenarios, accuracy requirements, and the like, and can also adjust the method that the plated layer is coated on the substrate, and so on, according to the actual using situation.

The present application also provides a mold for manufacturing the substrate of the aforementioned automobile plated part. Specifically, when manufacturing the substrate of the plated part of the automobile, a mold conforming to the substrate of the plated part of the automobile is firstly manufactured, and then the plated part of the automobile can be integrally injection-molded through the mold. Finally, the plated layer is coated onto the substrate of the formed plated part.

Figure 4:
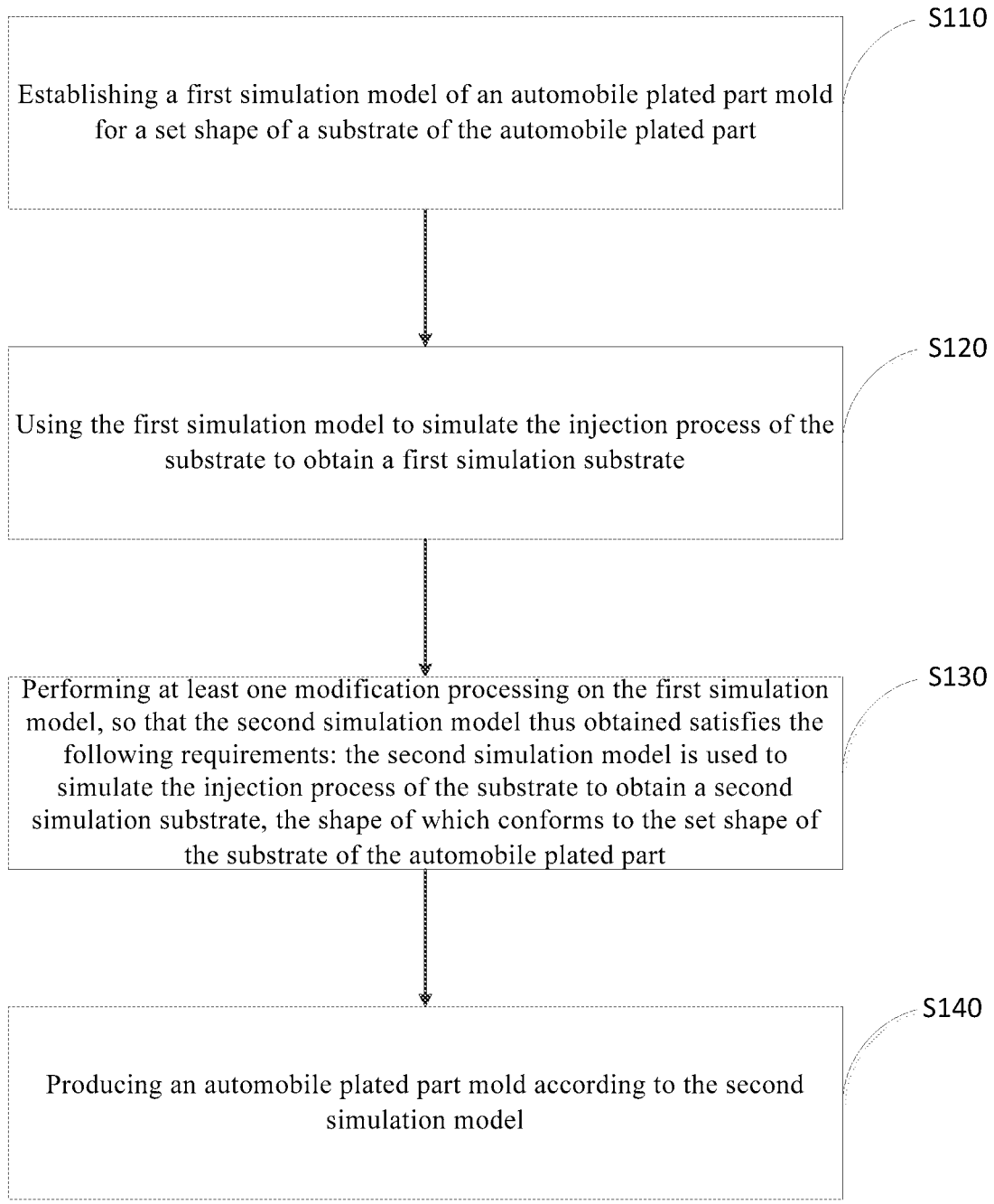
FIG. 4 is an overall flow chart of a method for manufacturing automobile plated part mold of the present application.

In addition, the present application also provides a manufacturing method for a mold for manufacturing the substrate of the aforementioned automobile plated part. As shown in FIG. 4, the manufacturing method includes the following steps:

S110: Establishing a first simulation model of an automobile plated part mold for a set shape of a substrate of an automobile plated part;

S120: Using the first simulation model to simulate the injection process of the substrate to obtain a first simulation substrate;

S130: Performing at least one modification processing on the first simulation model, so that the second simulation model thus obtained satisfies the following requirements: the second simulation model is used to simulate the injection process of the substrate to obtain a second simulation substrate, the shape of which can conform to the set shape of the substrate of the automobile plated part;

S140. Producing an automobile plated part mold according to the second simulation model.

The above steps S110-S140 will be described in detail in conjunction with specific embodiments.

In the present embodiment, the material of the automobile plated part is plastic. At present, during the injection molding process of plastic products, especially the plastic parts with complex structures and large sizes (such as the automobile plated parts as described above), some distortion will be caused to the molded product due to uneven shrinkage, uneven temperature, uneven molecular orientation etc., which will affect the shape and dimensional accuracy of the product. Therefore, the method for manufacturing mold of the present application firstly carries out CAE injection molding simulation on samples of automobile plated parts, and then uses soft mold actual testing and verification to finally obtain the automobile plated part molds meeting requirements. That is, through combination of simulation and actual measurement, the finished automobile plated part mold is manufactured. The substrate of the plated part that meets requirements can be manufactured through the automobile plated part mold.

Specifically, in step S110, a first simulation model of an automobile plated mold is established using a simulation software, such as Moldflow, for a set shape of a substrate of an automobile plated part. In the present embodiment, the set shape of the substrate of the automobile plated part is the shape of the substrate of the aforementioned automobile plated part. In the process of integral injection molding using a mold, the substrate of the produced automobile plated part easily deforms during cooling of the injection molding. Therefore, even the substrate of the automobile plated part manufactured by the mold having the same shape will be different from the intended shape of the substrate, making the substrate of the automobile plated part produced fail to meet the requirements. Therefore, in the present embodiment, the first simulation model is established to simulate the simulated deformation amount of the automobile plated part compared to the set shape during the injection cooling process.

In step S120, the injection molding process of the automobile plated part is simulated, i.e., the first simulation model is used to simulate the injection molding process of the substrate to obtain the first simulation substrate. In the cooling process of injection molding, the substrate will deform, that is, the first simulation substrate has a certain deformation amount with respect to the set shape of the substrate of the automobile plated part. In order to eliminate the deformation amount, in step S130, the deformation amount is offset by performing a modification processing on the second simulation model, so as to manufacture a substrate of automobile plated part that conforms to the set shape. For example, if the length of the main bar of the first simulation substrate shrinks by 1 cm with respect to the length of the main bar of the set shape of the substrate of the automobile plated part, the cavity length of the second simulation model corresponding to the main bar can be extended by 1 cm. In this way, if the first simulation substrate manufactured using the modified second simulation model still shrinks by 1 cm, the first simulation substrate just matches the set shape of the substrate of the automobile plated part. In this case, it can be considered that the modification processing performed on the second simulation model counteracts the deformation amount.

Figure 5:
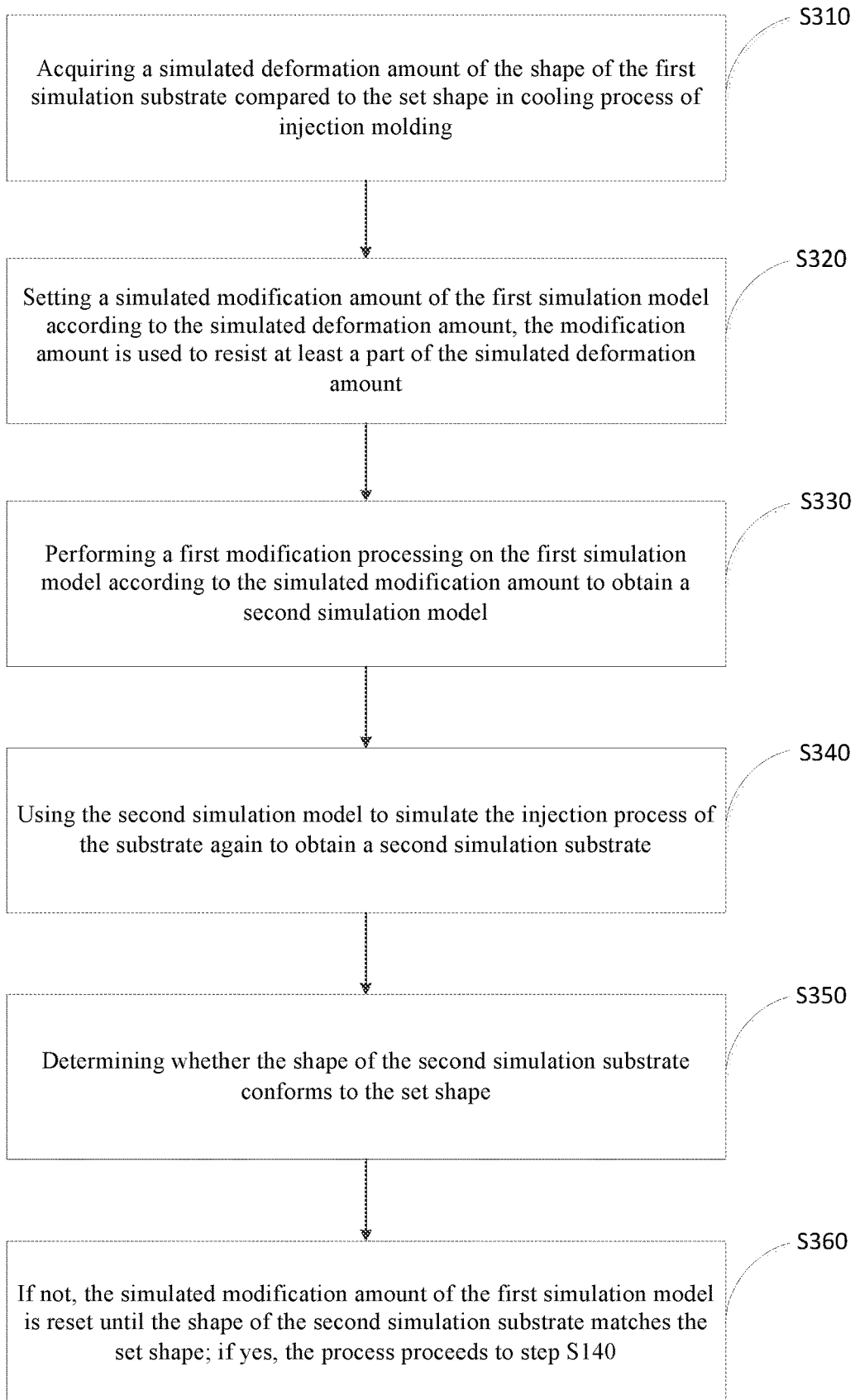
FIG. 5 is a detailed flowchart of step S130 of the manufacturing method of the present application.

Referring to FIG. 5, FIG. 5 shows a detailed flowchart of step S130. As shown in FIG. 5, in step S130, the following steps are further included:

S310: Acquiring a simulated deformation amount of the shape of the first simulation substrate compared to the set shape in the cooling process of the injection molding;

S320: Setting a simulated modification amount of the first simulation model according to the simulated deformation amount, and the modification amount is used to resist at least a part of the simulated deformation amount;

S330: Performing a first modification processing on the first simulation model according to the simulated modification amount to obtain a second simulation model;

S340: Using the second simulation model to simulate the injection process of the substrate again to obtain a second simulation substrate;

S350: Determining whether the shape of the second simulation substrate conforms to the set shape;

S360: If not, the simulated modification amount of the first simulation model is reset until the shape of the second simulation substrate matches the set shape; if yes, the process proceeds to step S140.

Specifically, in steps S310-S360 described above, the simulated modification amount of the first simulation model is artificially set modification data, and the artificially set modification data is input to the first simulation model to obtain the second Simulation model. In practical applications, the first simulation model is often subjected to a plurality of modification processing (adding different simulated modification amounts to the first simulation model) to obtain a second simulation model that meets the requirements (i.e., to use the second simulation model to simulate the injection process of the substrate again and the shape of the resulting second simulation substrate matches the set shape). Therefore, in step S130, the first simulation model is usually subjected to multiple modification processing until the obtained second simulation model meets requirements, then the process proceeds to step S140.

As a preferred embodiment of the present application, prior to performing step S320, in order to ensure the accuracy of the simulated injection molding result, a first soft mold may be manufactured according to the first simulation model, and the first soft mold may be used to manufacture the first soft mold sample. Then, the actual deformation amount of the first soft mold sample compared with the set shape in the cooling process is obtained, and the deviation between the actual deformation amount and the simulated deformation amount is compared. If the deviation is within a preset range (reasonable range determined according to the actual situation), it means that the simulated injection result is consistent with the actual injection molding result, i.e., the simulated injection molding result is accurate. If the deviation exceeds the preset range, it means that the simulated injection result is inconsistent with the actual injection result, that is, the simulated injection result is inaccurate. At this time, there may be an error in the simulation software or an error in the process of establishing the simulation model. Therefore, the simulation software may be replaced, the simulation software may be repaired, or the first simulation model may be re-established until the deviation between the actual deformation amount and the simulated deformation amount falls within the preset range.

In step S140, in order to detect the accuracy of the simulated injection molding result, a second soft mold is firstly manufactured according to the second simulation model, and a second soft mold sample of the substrate is manufactured using the second soft mold. Then it is judged whether the shape of the second soft mold sample matches the set shape. When the second soft mold sample matches the set shape, it indicates that the modification amount of the second simulation model offsets the deformation amount of the substrate of the automobile plated part, then the automobile plated part mold is manufactured according to the second simulation model.

If the second soft mold sample does not match the set shape, it indicates that the modification amount of the second simulation model does not counteract the deformation amount of the substrate of the automobile plated part. At this time, it is necessary to re-simulate the injection molding and remodify the first simulation model until the detected second soft mold sample matches the set shape. When remodifying the first simulation model, the amount of deformation of the second soft mold sample with respect to the set shape can be used as reference, the software can also be debugged or it can be checked whether there is any omission in the simulation injection process until the second soft mold sample is detected to match the set shape.

The present application can further ensure the accuracy of the simulated injection molding results by comparing the actual injection molding results with the simulated injection molding results. Moreover, since soft mold has the advantages of easy modification and low cost, adoption of soft mold in the actual verification process can improve the efficiency and save the cost. However, this does not limit the protection scope of the present application. Without considering the cost, a plurality of sets of hard molds can be used for actual test verification.

The automobile plated part molds finally produced by the manufacturing method should be qualified molds suitable for mass production (consistent with the substrate structure of the plated part).

Finally, the present application also provides an automobile, which comprises an automobile body and a plated part disposed on the automobile body, the plated part is disposed on a front bumper assembly of the automobile body; and the plated part is an automobile plated part described in any of the above solutions. Preferably, the shape of the plated part conforms to the shape of the front bumper assembly; when the plated part is fixed to the front bumper assembly, the plated part can form a semi-surrounded posture with the front bumper assembly when observed in a direction from the front of the automobile body toward the front face of the automobile. More preferably, the height of the main bar of the plated part has a feature that the height enables the main bar to be above the knee of a pedestrian at least when a collision occurs between the automobile and the pedestrian; the front bumper assembly is also provided with a front grille, and the main bar is located above the front grille.

So far the technical solutions of the present application have been described with reference to the preferred embodiments shown in the accompanying drawings. However, it can be easily understood by those skilled in the art that the protection scope of the present application is obviously not limited to these specific embodiments. Without departing from the principle of the present application, those skilled in the art can make equivalent changes or substitutions to the related technical features, and the technical solutions after these changes or replacements will fall within the protection scope of the present application.

What is claimed is:

1. An automobile plated part, comprising a substrate and a plated layer coated on the substrate, wherein the substrate includes a main bar, a first bar set and a second bar set extend from both ends of the main bar respectively;

wherein the first bar set includes two bars extending in different directions;

wherein the second bar set includes two bars extending in different directions:

wherein the first bar set includes a first bar extending from the first end of the main bar in a first direction and a second bar extending from the first end of the main bar in a second direction, wherein a first angle is formed between the first direction and the second direction;

wherein a third bar extends in a third direction from an end of the first bar away from the main bar, wherein a second angle is formed between the third direction and the first direction.

2. The automobile plated part according to claim 1, wherein a fourth bar extends in a fourth direction from an end of the second bar away from the main bar, wherein a third angle is formed between the fourth direction and the second direction.

3. The automobile plated part according to claim 2, wherein at least a portion of the substrate has connection parts through which the automobile plated part can be mounted to a front bumper assembly of the automobile, and the substrate can be fixed to the front bumper assembly by bonding or welding.

4. The automobile plated part according to claim 3, wherein after the automobile plated part is assembled to the front bumper assembly of the automobile, each of the first bar set and the second bar set has a bar extending toward the side of the automobile body closest to itself, so that the automobile plated part appears to surround the front bumper assembly of the automobile as viewed from the front of the automobile toward the front bumper assembly.

5. The automobile plated part according to claim 3, wherein the front bumper assembly is further provided with a front grille, and the main bar of the automobile plated part is located above the front grille.

6. The automobile plated part according to claim 1, wherein the first bar set and the second bar set are of symmetrical structures.

7. The automobile plated part according to claim 1, wherein combination of the main bar, the first bar set and the second bar set endows the entire automobile plated part with an X-shaped structure.

8. An automobile plated part mold, wherein the mold is used to manufacture a substrate for automobile plated part according to claim 1.

9. A method for manufacturing automobile plated part mold as defined in claim 8, wherein said manufacturing method comprises the following steps:

establishing a first simulation model of the automobile plated part mold based on a set shape of the substrate of the automobile plated part;

using the first simulation model to simulate injection process of the substrate to obtain a first simulation substrate;

performing at least one modification processing on the first simulation model, so that a second simulation model thus obtained satisfies the following requirements:

using the second simulation model to simulate the injection process of the substrate to obtain a second simulation substrate conforming to the set shape;

manufacturing the automobile plated part mold according to the second simulation model.

10. The method for manufacturing automobile plated part mold according to claim 9, wherein the step "establishing a first simulation model of the automobile plated part mold based on a set shape of the substrate of the automobile plated part" further includes:

establishing the first simulation model of the automobile plated part mold using a simulation software.

11. The method for manufacturing automobile plated part mold according to claim 10, wherein the step "performing at least one modification processing on the first simulation model" includes:

obtaining a simulated deformation amount of the shape of the first simulation substrate compared to the set shape during cooling of injection molding;

setting a simulated modification amount of the first simulation model according to the simulated deformation amount, which is used to counteract at least a part of the simulated deformation amount;

performing a first modification processing on the first simulation model according to the simulated modification amount to obtain the second simulation model;

using the second simulation model to simulate the injection process of the substrate again to obtain a second simulation substrate;

determining whether the shape of the second simulation substrate conforms to the set shape:

if no, the simulated modification amount of the first simulation model is reset until the shape of the second simulation substrate conforms to the set shape; if yes, the automobile plated part mold is manufactured according to the second simulation model.

12. The method for manufacturing automobile plated part mold according to claim 11, wherein before the step "setting a simulated modification amount of the first simulation model according to the simulated deformation amount", the step "performing at least one modification processing on the first simulation model" further comprises:

manufacturing a first soft mold according to the first simulation model, and manufacturing a first soft mold sample of the substrate using the first soft mold;

acquiring an actual deformation amount of the first soft mold sample in the cooling process compared to the set shape, and determining whether the deviation between the actual deformation amount and the simulated deformation amount is within a preset range;

if yes, the simulated modification amount of the first simulation model is set according to the simulated deformation amount; if not, the first simulation model is reestablished until the deviation between the actual deformation amount and the simulated deformation amount is within the preset range.

13. The method for manufacturing automobile plated part mold according to claim 9, wherein the step "manufacturing the automobile plated mold according to the second simulation model," includes:

manufacturing a second soft mold according to the second simulation model, and manufacturing a second soft mold sample of the substrate using the second soft mold;

determining whether the shape of the second soft mold sample conforms to the set shape;

if no, performing a modification processing again on the first simulation model to obtain the second simulation model, until the shape of the second soft mold sample conforms to the set shape; if yes, manufacturing the automobile plated part mold according to the second simulation model.

14. An automobile comprising an automobile body and a plated part disposed on the automobile body, wherein the plated part is disposed on a front bumper assembly of the automobile body; and wherein the plated part is an automobile plated part according to claim 1.

15. The automobile according to claim 14, wherein the shape of the plated part conforms to the shape of the front bumper assembly.

16. The automobile according to claim 14, wherein when the plated part is fixed to the front bumper assembly, the plated part can form a semi-surrounding posture with the front bumper assembly as viewed from the front of the automobile body toward the front face of the automobile.

17. The automobile according to claim 14, wherein the installation height of the main bar of the plated part has the following characteristics:

the height enables the main bar to be above the pedestrian's knees at least when he or she collides with the front of the automobile.

18. The automobile according to claim 14, wherein the front bumper assembly is further provided with a front grille, and the main bar is located above the front grille.

\* \* \* \* \*